United States Patent [19]

Fielden

[11] Patent Number: 4,558,303
[45] Date of Patent: Dec. 10, 1985

[54] METHODS OF AND APPARATUS FOR CONVERTING AN ANALOGUE VOLTAGE TO A DIGITAL REPRESENTATION

[75] Inventor: John S. Fielden, Ottery St. Mary, England

[73] Assignee: South Eastern Electricity Board, England

[21] Appl. No.: 576,063

[22] Filed: Feb. 1, 1984

Related U.S. Application Data

[63] Continuation of Ser. No. 294,658, Aug. 20, 1981, abandoned.

[30] Foreign Application Priority Data

Sep. 1, 1980 [GB] United Kingdom ................ 8028186

[51] Int. Cl.⁴ .......................................... H03K 13/02
[52] U.S. Cl. .............................. 340/347 AD; 307/360; 307/361; 340/347 NT; 340/347 M
[58] Field of Search ................ 340/347 AD, 347 NT, 340/347 CC, 347 M; 307/360, 361

[56] References Cited

U.S. PATENT DOCUMENTS 4,183,016  1/1980  Sawagata ................ 340/347 AD
4,187,466  2/1980  Kasson et al. ........... 340/347 AD X

OTHER PUBLICATIONS

Engineering Staff of the Federal Scientific Corp., Dithering Increases Dynamic Range ..., 8/1973, pp. 1–8.
Hoeschele, Analog-to-Digital/Digital-to-Analog Conversion Techniques, John Wiley & Sons, Inc., 1968, pp. 358–360.

Primary Examiner—T. J. Sloyan
Attorney, Agent, or Firm—Beveridge, DeGrandi & Weilacher

[57] ABSTRACT

An analogue voltage-to-digital voltage converter has a voltage divider with a plurality of stages each providing an output voltage for comparison with the unknown voltage and in addition provides interpolation between the output voltage to improve the accuracy. Interpolation is effected by adding a ramp voltage to the unknown ramping through a magnitude equivalent to the voltage of at least one stage. With one tap on the voltage divider selected, comparison of the unknown plus ramp voltage is effected successively as the voltage ramps. By noting when the combined voltage reaches the level of one of the divider output voltages and by counting the number of comparisons made from the time when the ramp voltage is at a predetermined magnitude and comparing this with the time taken to ramp through one or a plurality of whole divider stages, determination can be made of the magnitude of the unknown voltage to a fraction of a stage.

14 Claims, 1 Drawing Figure

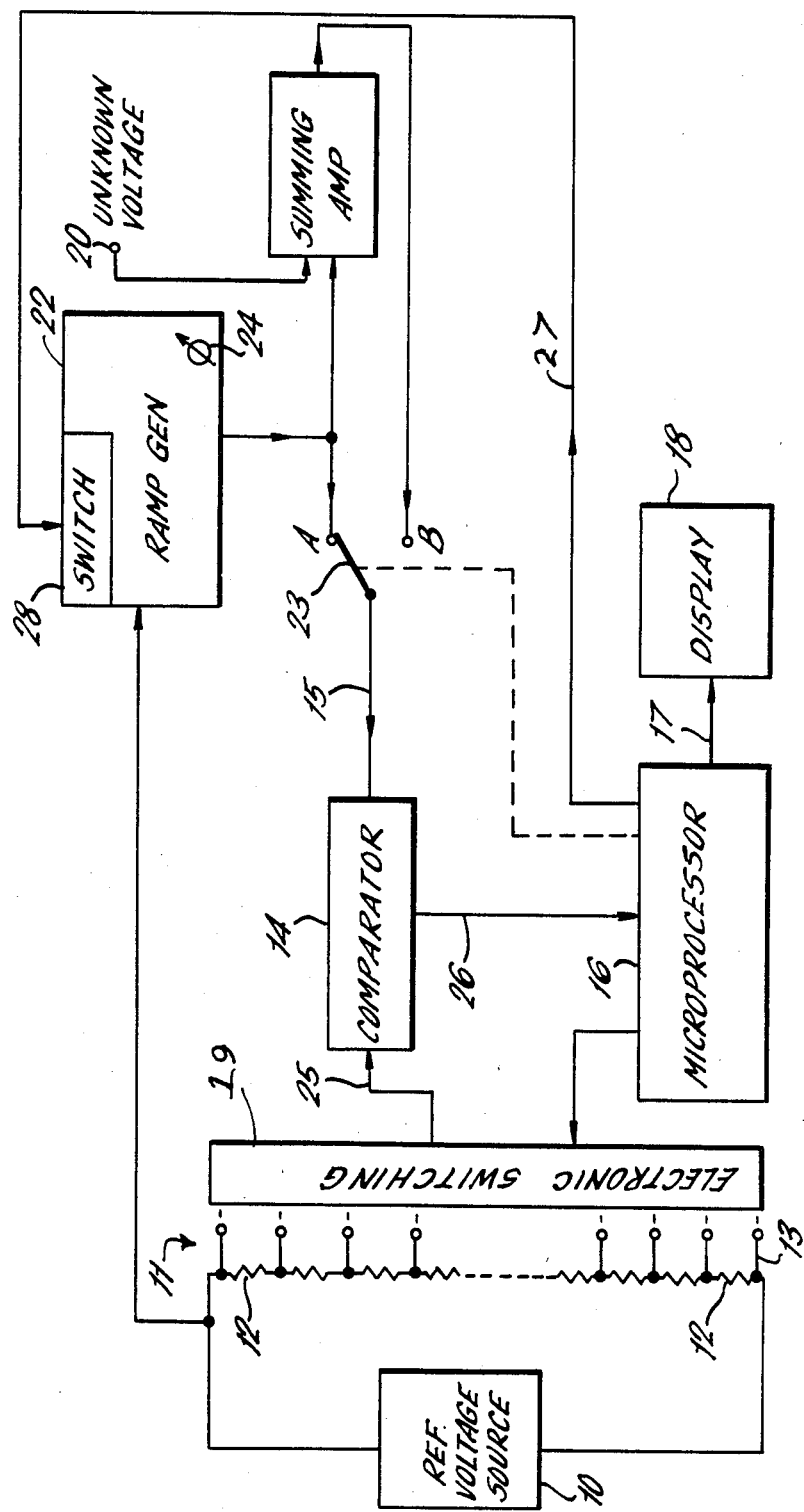

METHODS OF AND APPARATUS FOR CONVERTING AN ANALOGUE VOLTAGE TO A DIGITAL REPRESENTATION

CROSS-REFERENCE TO RELATED APPLICATION

This is a continuation of application Ser. No. 294,658, filed Aug. 20, 1981 and now abandoned.

BACKGROUND OF THE INVENTION

1. Field of the Invention

This invention relates to apparatus for and methods of converting an input analogue voltage into a digital representation.

2. Prior Art

It is well-known to change an analogue voltage to a digital representation by utilising a voltage divider to divide a known reference voltage into a number of equal intervals and then to compare the unknown input analogue voltage with the output voltages from the various stages of the divider to detect when the input voltage is equal to one of the output voltages.

With such an arrangement, the analogue-to-digital conversion is carried out with a resolution which is determined by the number of stages in the voltage divider. There is thus a limit to the resolution which can be achieved.

The potential divider, from a practical point of view, also may put a limit on the accuracy with which the conversion can be achieved. Thus, if there are 200 divider stages, any 100 stages must equal (within 1 stage) any other 100 stages to give 1% accuracy. It is thus difficult and expensive to implement an accurate analogue-to-digital conversion of more than, say, 256 divisions.

SUMMARY OF THE INVENTION

It is an object of the present invention to provide an improved method of and apparatus for analogue-to-digital conversion which will enable resolution to be effected within the stages of a potential divider by a linear interpolation. As will be further apparent, it is possible with the method and apparatus of the present invention to improve the effective accuracy by reducing the effect of non-linearity of the stages of the divider.

According to one aspect of the present invention a method of converting an input analogue voltage to a digital output signal comprises the steps of applying a first fixed reference voltage to a potential divider having N stages each of 1 unit, adding a reference ramp voltage, starting from a known magnitude $P_0$, to the input analogue voltage, and regularly repetitively comparing the magnitude of the combined voltage with the divider outputs to determine the magnitude Q of the input analogue voltage by determining the number $Q_0$ of the divider stage containing the magnitude of said input analogue voltage and by determining the fraction of a divider stage representing the difference between the actual magnitude Q of the input voltage and $Q_0$ from the fraction of the ramp period taken for the combined voltage to reach the magnitude of the next one of said divider outputs, and wherein an output is provided in digital form by combining $Q_0$ and said fraction.

In explaining this method, it is convenient to consider a simple case. The comparison is first effected over successive stages of the divider to determine the two divider outputs between which the combined voltage lies. Assume that the divider settng is left at one of these outputs. Suppose the unknown voltage lies one quarter of the way between the output voltage from stage $Q_0$ and the output from the next higher stage $Q_1$. If one then adds a linear ramp voltage to the unknown voltage, with the ramp starting at zero, and if the combined voltage is regularly repetitively compared with the divider outputs, with n comparisons being made in the interval during which the ramp voltage increases by a magnitude corresponding to one of the equal voltage intervals from the divider, then the successive comparisons, assuming that the output number read from the divider is the output of the lower limit of the divider stage, will indicate the magnitude $Q_0$ for $\frac{3}{4}n$ comparisons and will indicate the magnitude $Q_1$ (equals $Q_0+1$) for the next n/4 comparisons. Simple counting of the number of comparisons between the start of the repetitive comparing and the time when $Q_1$ is first indicated (that is to say, $\frac{3}{4}n$) will give the fractional part of a divider stage to be interpolated in obtaining the more accurate resolution of the unknown voltage.

It will be readily apparent, however, that the ramp need not start at zero, provided it starts from some known level. It is convenient therefore to start the repetitive comparing and counting procedure when the ramp reaches a value $P_0$ corresponding to the output of some stage of the divider. The ramp rate may be pre-determined so that the number n is known and the repetitive comparing need only be continued for the $\frac{3}{4}n$ comparisons.

By using a linear ramp, the fraction of the ramp cycle corresponds to the fraction of the ramp voltage change. Moreover this fraction can be determined digitally by counting the number of comparisons made during a ramping period before equality with $Q_1$ is obtained and comparing this with the total number of comparison periods in the ramp cycle.

It will be seen that, by this technique, increased resolution is obtained by interpolation between the outputs of the stages of the potential divider. The ramp voltage and repetitive comparing preferably continue over more than one stage of the divider. By doing this, the interpolation is no longer dependent on the exact accuracy of any one particular stage of the divider but is related to the average accuracy of a number of stages.

Suppose for example that the ramp continues for four successive stages $P_1$, $P_2$, $P_3$ and $P_4$. Assume, as before, that there are n comparisons made in the interval required for the ramp to change from the output of one stage to the output of the next. If the fractional value of the input voltage is one quarter of the way between two divider stage outputs, the above technique will result in the counting of $\frac{3}{4}n$ comparisons indicating the combined voltage is at the voltage of the output of stage $Q_0$, then the counting of n comparisons indicating the output of stage $Q_0+1$, n comparisons indicating $Q_0+2$, n comparisons indicating $Q_0+3$, and lastly the counting of n/4 comparisons indicating $Q_0+4$. There is a total of 4n comparisons. If these 4n values are summed and averaged, it will be seen that the required magnitude is determined by subtracting the appropriate total magnitude of the ramp from the average. This appropriate total magnitude is $(P_0+P_3)/2$ when the ramp increases to $P_4$. If the divider output voltages at the outputs of the consecutive stages differ by exactly one unit, this gives the same result as summing and averaging over one stage. If the divider output voltages do not differ by exactly one unit, improved accuracy is obtained by summing and averaging over 4n comparisons. Mathematically this is equivalent to summing all the comparison values taken, subtracting zero for each comparison taken while the ramp is between $P_0$ and $P_1$, subtracting one from each comparison value taken while the ramp is between $P_1$ and $P_2$, and so on, and finally averaging by dividing by the total number of comparisons and then subtracting $P_0$ from the average. It will be seen that the required magnitude is determined but that the accuracy is no longer dependent on the accuracy of one stage of the divider but depends on the average accuracy of a number of stages.

It will thus be seen that the method of the present invention enables the resolution of an analogue-to-digital converter to be increased beyond the resolution determined by the number of of stages in the potential divider by making use of linear interpolation between the stages. If the potential divider is highly accurate, then the increased resolution gives increased accuracy. However, as explained above, by making use of a ramp voltage extending over several divider stages, effectively, deviations in the size of the divider stages can be averaged out. Thus, if the ramp extends over 64 stages, then the overall linearity will be 64 times better than if only one stage were used. The ramping over a number of stages reduces the magnitude of the full scale reading. If the divider has 256 stages of output and it is required to ramp over 64 stages, then the full scale reading would have a maximum range of 192 stages.

It will be seen, therefore, that the present invention enables both increased resolution and, by reducing linearity problems, increased accuracy to be obtained, provided sufficient time is available to effect the measurement.

Although in the above explanation is has been assumed that the voltage ramp is an upwards ramp, this is not necessary. The ramping may be upwards or downwards, or ramps may be alternately upwards and downwards. The rate of ramping must be sufficiently slow to permit the necessary comparing to be effected whilst covering the desired number of divider stages for the interpolation. For the conversion of direct voltages or very slowly varying voltages, this does not present any problem. For measurements of voltage of alternating supplies, pulse sampling synchronised with the alternating waveform may be employed. If the waveform is assumed to be sinusoidal, since a summing and averaging technique is employed, it is possible to use a plurality of samples in each cycle. Typically, using the above-described technique for measuring a voltage at 50 Hz, it would take about 1 second for the analogue-to-digital conversion to be effected.

The invention furthermore includes within its scope an apparatus for converting an input analogue voltage to a digital output signal comprising a comparator, a potential divider having N equal stages, means for applying a first fixed reference voltage to said potential divider to provide N+1 comparison outputs to said comparator at equal intervals from 0 to N units, means for generating a reference ramp voltage starting from a known magnitude $P_0$, means for adding said reference ramp voltage to the input analogue voltage and applying the combined voltage to said comparator, means controlling said comparator to regularly and repetitively compare the combined ramp and input voltage with the divider outputs to determine the magnitude of the input analogue voltage by the number $Q_0$ of the divider stage defining one limit of the range containing the magnitude of said input analogue voltage and also to determine, from the fraction of the ramp period required for the combined voltage to reach the magnitude of the next one of said divider stage outputs, the fraction of a stage representing the difference between the actual magnitude Q of the input analogue voltage and the magnitude $Q_0$, and means providing an output digital representation of the sum of the magnitudes of $Q_0$ and said fraction.

The means for generating a ramp voltage starting from a known magnitude may comprise a ramp voltage generator, means for applying the ramp voltage to said comparator and means operative to initiate the repetitive sampling when the ramp voltage reaches a magnitude $P_0$ corresponding to one divider stage output.

Preferably the means for generating the ramp voltage is arranged to generate a voltage ramping over a number, greater than unity, of stages of the potential divider and the means controlling said comparator is arranged so that the regular repetitive comparing is continued over a period in which the ramp voltage changes by more than the voltage across one divider stage.

For the reasons previously described, if the comparing is over a period in which the ramp voltage changes by more than the voltage across one divider stage, then the advantages of averaging over the voltage of several stages (to improve accuracy) can be obtained by comparing the ramp voltage alone, as well as the combined ramp and unknown voltage, at regular intervals so that the computation assumes that the changes in divider stages occur after each "n" comparisons, rather than using the actual stage output voltage. Therefore, preferably means are provided for comparing the ramp voltage at regular intervals with the potential divider outputs to determine when the last required change in ramp voltage is complete. The apparatus may then include a microprocessor having means for counting the total number of comparisons over the whole ramping period, means for summing the digital magnitudes of all the comparisons over a period when the ramp changes from $P_0$ to $(P_0+m)$ units, where m is an integer greater than unity, means for correcting the sum for the counted divider stages in the ramp voltage, and means for dividing the corrected accumulated sum by the number of comparisons made and subtracting $P_0$ from the result to provide the required digital output.

Switching means may be provided for selectively applying either the ramp voltage or the combined ramp and unknown voltage to the comparator. The microprocessor may be arranged to operate the switching means so that the two comparisons are made alternately, and counting means may be provided to count the number of comparisons from the time when the ramp voltage is at magnitude $P_0$ to the time when the combined voltage reaches the output one stage of the divider. The counting can then continue until the ramp voltages reaches $P_0$+one digit. As indicated above, the operation may continue until the count reaches $P_0+m$ digits. The microprocessor may be arranged to sum all the readings indicating the magnitude of the combined voltage during this period, to average these readings by dividing the sum by the number of comparisons made, and then to subtract $P_0$.

BRIEF DESCRIPTION OF THE DRAWING

The accompanying drawing is a diagram illustrating one construction of an analogue-to-digital converter constituting one embodiment of the invention.

DESCRIPTION OF THE PREFERRED EMBODIMENT

Referring to the drawing there is shown a stablised voltage source 10 applying a stable known voltage to a potential divider 11 comprising 256 stages 12 with taps 13 between the resistors and the end of the divider, giving thereby 257 taps providing known voltage outputs with respect to one end of the divider. These reference voltages are utilised for comparison, in a comparator 14, with a voltage on a line 15.

The switching of the taps 13 to the comparator is controlled by a microprocessor 16. Conveniently an electronic switching unit 19 is employed.

The microprocessor 16, in response to the output from the comparator 14, provides a digital output representation at line 17 representing the magnitude of an analogue voltage on the lead 15. The digital representation at output 17 may be applied to an indicator 18 or may be utilised in other ways, e.g. in digital data processing apparatus. The construction thus far described operates in a manner similar to a conventional analogue-to-digital converter and, with present-day microprocessors, it is possible to make a comparison with each of 256 tapped reference voltages and obtain a reading, say, every 40 microseconds.

In the following description it is assumed that the voltage to be measured is a sinusoidal or substantially sinusoidal voltage waveform having a frequency of 50 Hz. Synchronised sampling is employed with four samples in each cycle of the waveform. Because an averaging technique is employed, it is possible to measure an alternating voltage in this way, provided the samples are taken at predetermined sample points synchronised with the alternating waveform.

In the embodiment shown in the accompanying drawing, the unknown voltage to be converted is applied to a terminal 20 forming one input of a summing amplifier 21 having a second input from a ramp voltage generator 22 which generates a linear ramp voltage extending over the time period required to obtain the appropriate number of samples using synchronised sampling of an alternating waveform. The input 15 of the comparator 14 is connected by a switch 23 to one or the other of two terminals A and B. The switch 23 is controlled by the microprocessor 16 in a manner to be described later. The terminal A is connected to the output of the ramp generator 22 whilst the terminal B is connected to the output of the summing unit 21.

The comparator has a second input 25 which is connected by the aforementioned switching unit 19 sequentially to the selected taps 13 on the voltage divider 11. The comparator thus compares the voltage on the selected tap with the sum of the unknown voltage and the ramp voltage. When equality is reached, the comparator provides an output at line 26 to the microprocessor.

In measuring an alternating waveform, an offset voltage of known magnitude is added to the unknown to ensure that the samples are all of the same polarity. This offset is provided by the ramp generator. Because of the slow rate of ramping required for measurement purposes, provision is made for the ramp generator to ramp very quickly to the offset voltage before it starts the slow ramp. The offset voltage is conveniently the voltage halfway along the divider. The rapid ramp is therefore readily controlled by repetitive comparison, at a fast rate and with switch 23 in position A, of the rapidly changing ramp voltage with the divider outputs and stopping the fast ramp when it has reached the voltage of stage number 128. The slow ramp is then initiated. The required offset is thus obtained inherently from the divider output by control of the ramp generator 22 from the microprocessor 16, as indicated at line 27, the ramp generator having a switch 28 operated to initiate a slow ramp when the fast ramp voltage reaches the voltage of the appropriate divider stage, as indicated by a signal on lead 26.

As will be apparent from the following decription, the ramping may be upwards or downwards or may be alternately upwards and downward. In explaining the construction, however, it is convenient to assume that the voltage is ramping upwards. The switch 23 is put in the position A and readings are taken of the value P determined by the comparator and microprocessor. These readings P are indicative of one limit of the divider stage which embraces the instantaneous magnitude of the ramp voltage at the time the comparison is made. These readings are made frequently e.g. very 60 or 100 microseconds and, in this particular embodiment, this is done while the voltage is slowly ramping upwardly. Eventually the ramp voltage will pass to the output of the next stage of the divider network, and the indicated output will change. This value is taken as the datum value $P_0$. The switch 23 is then placed in position B and the reading Q of the combined unknown and ramp voltage is noted in the microprocessor 16. This reading Q is indicative of the divider output on one side of the divider stage within which the instantaneous value of the combined unknown and ramp voltages lies. The first such reading after the ramp voltage reaches $P_0$ is designated $Q_0$. The switch is then switched back to position A and a reading taken of the magnitude of the ramp voltage. The voltage is ramping slowly and this reading will still be $P_0$, as for the first reading taken. The reading is compared with the previously noted value $P_0$ and, since there is no change, the switch is put back into position B and a second reading $Q_1$ of the magnitude of Q is obtained and, in the microprocessor 16, is added to the first reading to give a total $Q_0+Q_1$. This process is continued, determining alternately P and Q until eventually the value of P suddenly changes from $P_0$ to $P_0$ plus one digit. It would at this point be possible to determine the value of the unknown voltage by dividing the accumulated sum $Q_0+Q_1+Q_2+\ldots Q_{n-1}$ by the number n of readings taken and subtracting $P_0$. The value obtained in this way is a linear interpolation between the voltages of two stages of the divider. Suppose the unknown voltage was, for example, one quarter of the way up from the voltage of one stage to the voltage of the next. Then the first three quarters of the n readings would give the same value $Q_0$ whilst the last quarter of the n readings would have the value $(Q_0+1)$. By taking a large number of readings, any desired resolution can be obtained.

In the particular embodiment being described, the ramping continues upwardly for 64 divider stages beyond the magnitude $P_0$. To permit this, the magnitude of the unknown voltage must be less than the sum of the voltages of 192 divider stages so as to permit comparisons to be made with the potential divider output when the maximum ramp voltage is added. The averaging is effected over the whole number of samples of the 50 Hz waveform in each cycle. 256 such waveform samples are taken over the whole range of the ramp voltage. It is convenient to make provision, indicated diagrammatically at 24, for adjusting the ramp rate so that the time taken to change by the voltage of a single divider stage is the same as the time taken for making n reading. The reading rate is controlled by the microprocessor 16.

The measured values of all the readings of combined ramp and unknown voltage (i.e. the divider stage numbers noted from the comparison) are summed. The sum is corrected by deducting one unit for each reading taken when the ramp voltage is assumed to lie between one and two units above $P_0$, deducting two units for each reading taken when the measured ramp voltage is assumed to lie between two and three units above $P_0$ and so on. The corrected sum is divided by the total number of readings, and $P_0$ is deducted to obtain thereby the magnitude of the unknown voltage. This computation is effected in the microprocessor 16. It will be readily apparent that the various steps of the computation may mathematically be effected in a different order.

If the unknown voltage is a direct voltage, or a voltage which changes only very slowly, then there is adequate time to effect the necessary measurements. As has been explained, the device described, however, can readily be used for making measurements of the voltage of an alternating mains supply, e.g. at a frequency of say 50 Hz, by synchronising the operation of the microprocessor with the mains supply frequency.

I claim:

1. A method of converting an input analogue voltage to a digital output signal indicative of the magnitude of the input analgoue voltage, said method comprising:
    applying a fixed reference voltage to a potential divider having N equal stages, each stage being of one unit magnitude, to provide (N+1) divider output voltages at equal voltage intervals, the input analogue voltage having an integral value component corresponding to a maximum integral number of said equal voltage intervals and a fractional value component corresponding to the difference between said integral value component and the actual value of the input analogue voltage;
    generating a ramp voltage having a maximum ramp amplitude greater than the magnitude of one of said equal voltage intervals;
    combining the input analogue voltage with the reference ramp voltage to provide a combined voltage;
    repetitively comparing the combined voltage with the divider output voltages at a regular comparison rate to provide a plurality of comparisons with the divider output voltages during the time period required for the ramp voltage to change by an amount equal to the magnitude of one of said equal voltage intervals;
    determining the number of said comparisons at said regular comparison rate in the time required for the ramp voltage to change by an amount equal to the magnitude of one of said voltage intervals;
    determining the proportion of said number of said comparisons at said regular comparison rate in the time required, after the ramp voltage is at a magnitude corresponding to the output voltage of one of said divider stages, for the combined voltage to reach magnitude corresponding to the output voltage of one of the divider stages;
    digitally determining from said proportion the fraction of the magnitude of said equal voltage intervals representing said fractional value component of the actual magnitude of the input analogue voltage; and
    on each said comparison summing the digital values Q, which corresponds to the largest integral number of said equal voltage intervals contained in each repetitively compared combined voltage, averaging the sum over said number of successive comparisons and deducting the digital value of the ramp voltage at the start of said summing and averaging from said averaged sum to provide a digital output signal indicative of the actual magnitude of the input analogue voltage.

2. A method as claimed in claim 1 further comprising adjusting the ramping rate of the ramp voltage so that said number of said comparisons is a predetermined number n.

3. A method as claimed in claim 1 in which the ramp amplitude is greater than the magnitude of a plurality of said equal voltage intervals and said summing and averaging is continued after a first said number of successive comparisons for at least one further said number of successive comparisons, and for each said further said number of successive comparisons corresponding unit quantities are deducted from said sum before averaging.

4. A method as claimed in claim 1 in which the repetitive comparing of the combined voltage is started when the ramp voltage reaches the output voltage of a stage $P_0$ of the divider.

5. A method as claimed in claim 3 in which the repetitive comparing of the combined voltage is started when the ramp voltage reaches the output voltage of a stage $P_0$ of the divider.

6. A method as claimed in claim 1 wherein the ramp voltage ramps upwardly.

7. A method as claimed in claim 1 wherein the ramp voltage ramps downwardly.

8. A method as claimed in claim 1 wherein the ramp voltage ramps alternately upwardly and downwardly.

9. An apparatus for converting an input analogue voltage to a digital output signal indicative of the magnitude of the input analogue voltage, said apparatus comprising:
    input means for receiving an input analogue voltage;
    a potential divider having N equal stages, each having an output;
    means for applying a fixed reference voltage to said potential divider to provide (N+1) divider output voltages at equal voltage intervals, the input analogue voltage having an integral value component corresponding to a maximum integral number of said equal voltage intervals and a fractional value component corresponding to the difference between said integral value component and the actual value of the input analogue voltage;
    means for generating a ramp reference voltage having a maximum ramp amplitude greater than the magnitude of one of said equal voltage intervals;
    means for combining said ramp reference voltage with said input analogue voltage to provide a combined voltage;
    a comparator arranged for repetitively comparing the combined voltage with the divider output voltages at a regular comparison rate to provide a plurality of comparisons with the divider output voltages during the time period required for the ramp voltage to change by an amount equal to the magnitude of one of said equal voltage intervals, said comparator indicating on each said comparison the digital value Q which corresponds to the largest integral number of said equal voltage intervals contained in each repetitively compared combined voltage; and digital means for:

(a) determining the number of said comparisons at said regular comparison rate in the time required for the ramp voltage to change by an amount equal to the magnitude of one of said voltage intervals;

(b) determining the proportion of said number of said comparisons at said regular comparison rate in the time required, after the ramp voltage is at a magnitude corresponding to the output voltage of one of said divider stages, for the combined voltage to reach a magnitude corresponding to the output voltage of one of the divider stages;

(c) determining from said proportion the fraction of the magnitude of said voltage intervals representing said fractional value component of the actual magnitude of the input analogue voltage; and (d) summing the values Q, averaging the sum over said number of successive comparisons, and deducting from said averaged sum the digital value of the ramp voltage at the start of said summing and averaging to provide a digital output signal indicative of the actual magnitude of the input analogue voltage.

10. Apparatus as claimed in claim 9 in which said means for generating is arranged to provide a ramp reference voltage having a ramp amplitude greater than the magnitude of a plurality of said equal voltage intervals, and said means for digitally determining is arragned to continue summing and averaging the values Q after a first said number of successive comparisons for at least one further said number of successive comparisons, and to deduct from said sum before averaging corresponding unit quantities for each said further said number of comparisons.

11. Apparatus as claimed in claim 9 in which the comparator is arranged additionally for comparing the ramp reference voltage with the divider output voltages to provide indications of when the ramp reference voltage traverses individual divider output voltages.

12. Apparatus as claimed in claim 9 further comprising means for adjusting the ramping rate of the ramp voltage so that said number of said comparisons is a predetermined number n.

13. Apparatus as claimed in claim 9 in which the comparator is arranged additionally for comparing the ramp reference voltage with the divider output voltages to provide indications of when the ramp reference voltage traverses individual divider output voltages, said means for digitally determining being responsive to the ramp reference voltage traversing the output voltage of a stage $P_0$ to initiate said repetitive comparison of the combined voltage with the divider output voltages.

14. Apparatus as claimed in claim 13 in which the comparator is arranged in association with a switch for comparing the ramp reference voltage with the divider output voltages alternately with said repetitive comparisons of the combined voltage during said number of comparisons, and said means for digitally determining is arranged to monitor said number of comparisons in response to indications from the comparator of when the ramp reference voltage traverses the divider output voltage of at least the stage $P_0+1$.

* * * * *